(12) United States Patent
Wu et al.

(10) Patent No.: US 11,562,289 B2
(45) Date of Patent: Jan. 24, 2023

(54) LOOSELY-COUPLED INSPECTION AND METROLOGY SYSTEM FOR HIGH-VOLUME PRODUCTION PROCESS MONITORING

(71) Applicant: KLA-Tencor Corporation, Milpitas, CA (US)

(72) Inventors: Song Wu, Shanghai (CN); Yin Xu, Shanghai (CN); Andrei V. Shchegrov, Campbell, CA (US); Lie-Quan Lee, Fremont, CA (US); Pablo Rovira, Milpitas, CA (US); Jonathan Madsen, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 823 days.

(21) Appl. No.: 16/287,523

(22) Filed: Feb. 27, 2019

(65) Prior Publication Data
US 2020/0184372 A1 Jun. 11, 2020

Related U.S. Application Data

(60) Provisional application No. 62/776,292, filed on Dec. 6, 2018.

(51) Int. Cl.
| | |
|---|---|
| *G06N 20/00* | (2019.01) |
| *G01Q 30/04* | (2010.01) |
| *H01J 37/26* | (2006.01) |
| *G01N 21/95* | (2006.01) |

(Continued)

(52) U.S. Cl.
CPC ......... *G06N 20/00* (2019.01); *G01N 21/9501* (2013.01); *G01N 23/201* (2013.01); *G01Q 30/04* (2013.01); *G03F 7/70625* (2013.01); *H01J 37/261* (2013.01); *G01N 2201/126* (2013.01); *G01N 2223/305* (2013.01); *G01N 2223/306* (2013.01)

(58) Field of Classification Search
CPC .... G01B 11/02; G01B 2210/56; G01N 21/59; G01N 21/9501; G01N 23/201; G01N 2201/126; G01N 2223/305; G01N 2223/306; G03F 7/70625; G01C 30/04; G06N 20/00; H01J 37/261; H01L 22/12
See application file for complete search history.

(56) References Cited

U.S. PATENT DOCUMENTS

| | | |
|---|---|---|
| 6,816,570 B2 | 11/2004 | Janik et al. |
| 7,478,019 B2 | 1/2009 | Zangooie et al. |
| 9,535,018 B2 | 1/2017 | Peterlinz et al. |

(Continued)

*Primary Examiner* — Mark R Gaworecki
(74) *Attorney, Agent, or Firm* — Suiter Swantz pc llo

(57) ABSTRACT

A metrology system is disclosed. In one embodiment, the metrology system includes a controller communicatively coupled to a reference metrology tool and an optical metrology tool, the controller including one or more processors configured to: generate a geometric model for determining a profile of a test HAR structure from metrology data from a reference metrology tool; generate a material model for determining one or more material parameters of a test HAR structure from metrology data from the optical metrology tool; form a composite model from the geometric model and the material model; measure at least one additional test HAR structure with the optical metrology tool; and determine a profile of the at least one additional test HAR structure based on the composite model and metrology data from the optical metrology tool associated with the at least one HAR test structure.

37 Claims, 9 Drawing Sheets

(51) Int. Cl.
    *G01N 23/201* (2018.01)
    *G03F 7/20* (2006.01)

(56) References Cited

U.S. PATENT DOCUMENTS

| | | |
|---|---|---|
| 2012/0275568 A1 | 11/2012 | Mazor et al. |
| 2012/0275569 A1 | 11/2012 | Mazor et al. |
| 2015/0032398 A1 | 1/2015 | Peterlinz et al. |
| 2016/0223476 A1 | 8/2016 | Quintanilha |
| 2017/0167862 A1 | 6/2017 | Dziura et al. |
| 2017/0205342 A1 | 7/2017 | Krishnan et al. |

LOOSELY-COUPLED INSPECTION AND METROLOGY SYSTEM FOR HIGH-VOLUME PRODUCTION PROCESS MONITORING

CROSS-REFERENCE TO RELATED APPLICATION

The present application claims the benefit under 35 U.S.C. § 119(e) of U.S. Provisional Application Ser. No. 62/776,292, filed Dec. 6, 2018, entitled LOOSELY COUPLED INSPECTION AND METROLOGY SYSTEM FOR HIGH-VOLUME PRODUCTION PROCESS MONITORING, naming Song Wu, Yin Xu, Andrei Shchegrov, Lie-Quan Lee, Pablo Rovira, and Jonathan Madsen as inventors, which is incorporated herein by reference in the entirety.

TECHNICAL FIELD

The present invention generally relates to the fields of inspection and metrology, and, more particularly, to a system and method for high-volume production process monitoring.

BACKGROUND

Demand for electronic logic and memory devices with ever-smaller footprints and features presents a wide range of manufacturing challenges beyond fabrication at a desired scale. Increasingly complex structures result in increasing numbers of parameters which must be monitored and controlled to maintain device integrity. One important characteristic in the field of semiconductor fabrication is the critical dimension(s) (CD) of device features, including the critical dimension of high aspect ratio (HAR) structures.

Traditionally, optical critical dimension (OCD) metrology tools have been used to measure critical dimensions of HAR structures. However, the accuracy of OCD modeling of HAR structures is limited due to the fact that light penetrating a sample decays with the depth of the sample being measured. Accordingly, detailed HAR structure profile information is difficult to obtain. Additionally, deeper HAR structures may be extremely difficult to measure using traditional OCD modeling. The inability to measure deeper HAR structures is exasperated by the ever-increasing depth of samples. As the number of layers in a sample increases, the depth of HAR structures increases, which may cause the HAR structures to become more bent and/or twisted. As such, the need to accurately measure the entire profile of HAR structures continues to increase, while the effectiveness of OCD modeling techniques continues to decrease as samples become deeper.

Another approach which has been used to measure CDs of HAR structures is the use of transmission small angle X-ray scattering (T-SAXS) techniques. T-SAXS techniques are more accurate at measuring CDs and profiles of HAR structures. However, due to the fact that T-SAXS utilizes X-rays which are transmitted through the sample, signals collected by a detector are very weak. In this regard, T-SAXS techniques suffer from extremely low throughput, which inhibits its adoption in high-sampling and/or high-volume production manufacturing.

A previous hybrid approach involves combining OCD modeling techniques with the T-SAXS techniques. However, under this hybrid approach, every single sample must be measured by both the OCD tool and the X-ray tool, causing the hybrid approach to suffer from the low-throughput of the T-SAXS technique. Furthermore, analysis, computation, and optimization of a model which combines metrology information from an OCD tool and an X-ray tool has been difficult to achieve, leading to inaccurate results.

Therefore, it would be desirable to provide a system and method which cure one or more of the shortfalls of the previous approaches identified above.

SUMMARY

A metrology system for high-aspect ratio (HAR) structures is disclosed. In one embodiment, the metrology system includes a controller communicatively coupled to a reference metrology tool and an optical metrology tool. The controller may include one or more processors configured to execute program instructions configured to cause the one or more processors to: generate a geometric model for determining a profile of a test HAR structure from metrology data from reference metrology tool; generate a material model for determining one or more material parameters of a test HAR structure from metrology data from the optical metrology tool; form a composite model from the geometric model and the material model for determining a profile of a test HAR structure based on metrology data from the optical metrology tool; measure at least one additional test HAR structure with the optical metrology tool; and determine a profile of the at least one additional test HAR structure based on the composite model and metrology data from the optical metrology tool associated with the at least one HAR test structure.

A metrology system for high-aspect ratio (HAR) structures is disclosed. In one embodiment, the metrology system includes a reference metrology tool. In another embodiment, the metrology system includes an optical metrology tool. In another embodiment, the metrology system includes a controller communicatively coupled to the reference metrology tool and the optical metrology tool, the controller including one or more processors configured to execute program instructions configured to cause the one or more processors to: generate a geometric model for determining a profile of a test HAR structure from metrology data from the reference metrology tool; generate a material model for determining one or more material parameters of a test HAR structure from metrology data from the optical metrology tool; form a composite model from the geometric model and the material model for determining a profile of a test HAR structure from metrology data from the optical metrology tool; measure at least one additional test HAR structure with the optical metrology tool; and determine a profile of the at least one additional test HAR structure based on metrology data from the optical metrology tool associated with the at least one HAR test structure based on the composite model.

A metrology method is disclosed. In one embodiment, the metrology method includes generating a geometric model for determining a profile of a test HAR structure from metrology data from a reference metrology tool; generating a material model for determining one or more material parameters of a test HAR structure from metrology data from an optical metrology tool; forming a composite model from the geometric model and the material model for determining a profile of a test HAR structure from metrology data from the optical metrology tool; measuring at least one additional test HAR structure with the optical metrology tool; and determining a profile of the at least one additional test HAR structure based on the final composite model and metrology data from the optical metrology tool associated with the at least one HAR test structure.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION

Figure 1:
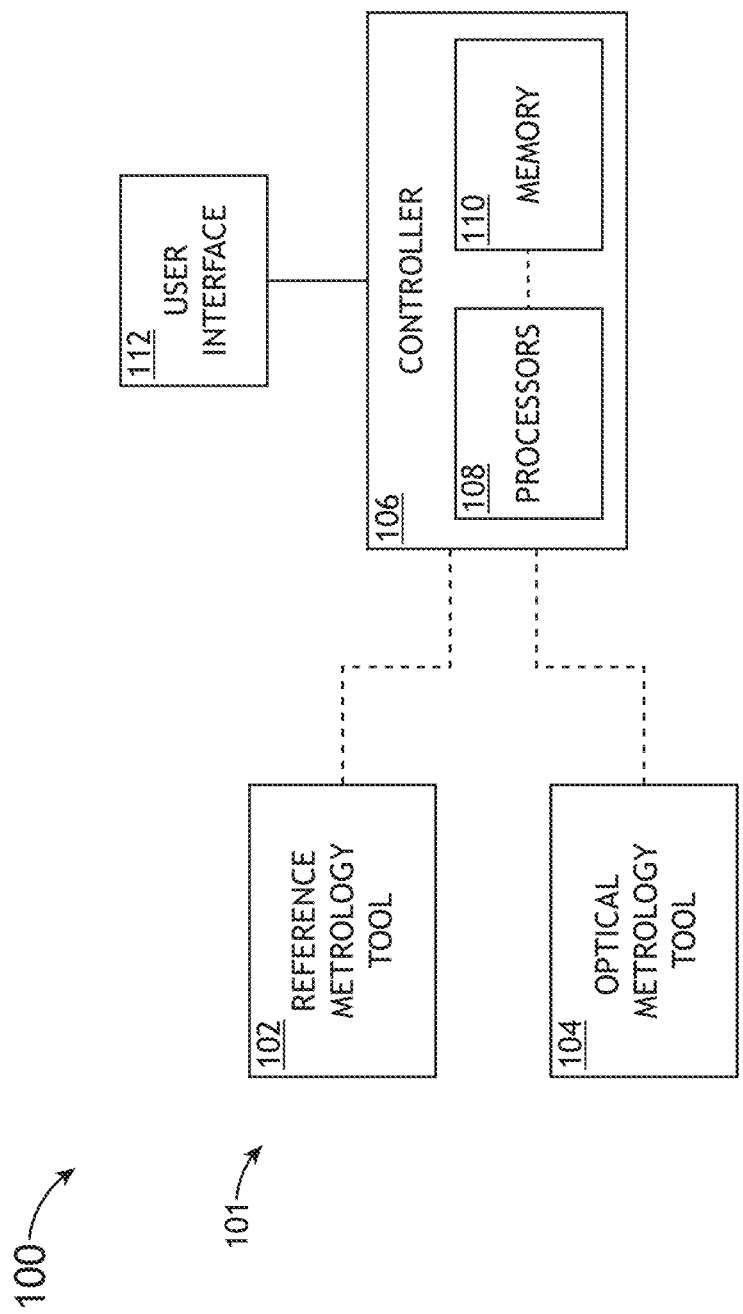
FIG. 1 illustrates a simplified block diagram of a metrology system, in accordance with one or more embodiments of the present disclosure.

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Traditionally, optical critical dimension (OCD) metrology tools have been used to measure critical dimensions of HAR structures. However, the accuracy of OCD modeling of HAR structures is limited due to the fact that light penetrating a sample decays with the depth of the sample being measured. Another approach which has been used to measure CDs of HAR structures is the use of transmission small angle X-ray scattering (T-SAXS) techniques. Although T-SAXS techniques are more accurate at measuring CDs and profiles of HAR structures, T-SAXS techniques suffer from extremely low throughput, which inhibits its adoption in high-volume production process monitoring. The use of X-ray fluorescence (XRF) and electron microscope analysis to measure thin films is described generally in U.S. Pat. No. 6,816,570, filed Mar. 7, 2002, entitled MULTI-TECHNIQUE THIN FILM ANALYSIS TOOL, which is incorporated herein by reference in the entirety. Furthermore, a previous hybrid approach involves combining OCD modeling techniques with the T-SAXS techniques. However, under this hybrid approach, every single sample must be measured by both the OCD tool and the X-ray tool. Furthermore, analysis, computation, and optimization of a model which combines metrology information from an OCD tool and an X-ray tool has been difficult to achieve, leading to inaccurate results. A hybrid approach combining T-SAXS technology with optical metrology tools is described generally in U.S. Pat. No. 9,535,018 B2, filed Nov. 7, 2013, entitled COMBINED X-RAY AND OPTICAL METROLOGY which is incorporated herein by reference in the entirety.

Reference will now be made in detail to the subject matter disclosed, which is illustrated in the accompanying drawings.

Referring generally to FIGS. 1-6C, a system and method for high-volume production process monitoring is described, in accordance with one or more embodiments of the present disclosure.

Embodiments of the present disclosure are directed to a loosely-coupled system for metrology or inspection with high-throughput and high-precision for high-volume production monitoring. More particularly, embodiments of the present disclosure are directed to a system including a high-resolution/low-throughput reference tool for high-precision reference measurement combined with a lower-resolution/high-throughput optical tool. It is noted herein that the system including a reference metrology tool and an optical metrology tool which utilize the same modeling aspect may facilitate high-volume production process monitoring.

Further embodiments of the present disclosure are directed to a method for measuring critical dimensions (CDs) of high-aspect ratio (HAR) structures within a sample. In one embodiment, the method includes combining metrology data acquired by a reference metrology tool with metrology data acquired by an optical metrology tool to generate a composite model which may be used to determine profiles and CDs of HAR structures.

FIG. 1 illustrates a simplified block diagram of a metrology system 100, in accordance with one or more embodiments of the present disclosure. The system 100 may include, but is not limited to, a metrology tool cluster 101, a controller 106, and a user interface 112. The metrology tool cluster 101 may include one or more metrology tools, one or more inspection tools, and the like. For example, as shown in FIG. 1, the metrology tool cluster 101 includes a reference metrology tool 102 and an optical metrology tool 104.

In some embodiments, the reference metrology tool 102 includes a high-resolution metrology tool. For example, the reference metrology tool 102 may include an X-ray metrology tool. For instance, the reference metrology tool 102 may include a soft X-ray metrology tool, a small-angle X-ray scattering tool (e.g., T-SAXS, CD-SAXS), and the like. By way of another example, the reference metrology tool 102 may include, but is not limited to, an electron-beam metrology tool, a scanning electron microscope (SEM), a transmission electron microscope (TEM), an atomic force microscope (AFM), and the like. In another embodiment, the optical metrology tool 104 includes a high-throughput metrology tool. For example, the optical metrology tool 104 may include, but is not limited to, an optical critical dimension (OCD) metrology tool.

Although much of the present disclosure is shown and described in the context of metrology, this is not to be regarded as a limitation of the present disclosure, unless noted otherwise herein. It is noted herein that embodiments of the present disclosure may be applied in inspection contexts other than metrology. For example, it is contemplated herein that the system and method of the present disclosure may be applied as a loosely-coupled inspection system which utilizes a reference tool (e.g., X-ray tool) for fine-detailed scanning, and an optical tool for coarse scanning which share similar modeling aspects.

In one embodiment, the reference metrology tool 102 is configured to collect metrology data of a sample, and transmit the collected metrology data to the controller 106. Similarly, in another embodiment, the optical metrology tool 104 is configured to collect metrology data of a sample, and transmit the collected metrology data to the controller 106. It is noted herein that the controller 106 may be communicatively coupled to the various tools of the metrology tool cluster 101 (e.g., the reference metrology tool 102 and the optical metrology tool 104) using any techniques known in the art.

In one embodiment, controller 106 includes one or more processors 108 and memory 110. In another embodiment, the one or more processors 108 may be configured to execute a set of program instructions stored in memory 110, wherein the set of program instructions are configured to cause the one or more processors 108 to carry out the steps of the present disclosure.

It is noted herein that the one or more components of system 100 may be communicatively coupled to the various other components of system 100 in any manner known in the art. For example, the one or more processors 108 may be communicatively coupled to each other and other components via a wireline (e.g., copper wire, fiber optic cable, and the like) or wireless connection (e.g., RF coupling, IR coupling, data network communication (e.g., 3G, 4G, 4G LTE, 5G, WiFi, WiMax, Bluetooth and the like)).

In one embodiment, the one or more processors 108 may include any one or more processing elements known in the art. In this sense, the one or more processors 108 may include any microprocessor-type device configured to execute software algorithms and/or instructions. In one embodiment, the one or more processors 108 may consist of a desktop computer, mainframe computer system, workstation, image computer, parallel processor, or other computer system (e.g., networked computer) configured to execute a program configured to operate the system 100, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 108. In general, the term "processor" may be broadly defined to encompass any device having one or more processing elements, which execute program instructions from memory 110. Moreover, different subsystems of the system 100 (e.g., reference metrology tool 102, optical metrology tool 104, controller 106) may include processor or logic elements suitable for carrying out at least a portion of the steps described throughout the present disclosure. Therefore, the above description should not be interpreted as a limitation on the present disclosure but merely an illustration.

The memory 110 may include any storage medium known in the art suitable for storing program instructions executable by the associated one or more processors 108 and the data received from the tools of the metrology tool cluster 101 (e.g., reference metrology tool 102, optical metrology tool 104, controller 106). For instance, the memory 110 may include, but is not limited to, a read-only memory (ROM), a random access memory (RAM), a magnetic or optical memory device (e.g., disk), a magnetic tape, a solid state drive, and the like. It is further noted that memory 110 may be housed in a common controller housing with the one or more processors 108. In an alternative embodiment, the memory 110 may be located remotely with respect to the physical location of the processors 108, controller 106, and the like. In another embodiment, the memory 110 maintains program instructions for causing the one or more processors 108 to carry out the various steps described through the present disclosure.

In one embodiment, a user interface 112 is communicatively coupled to the controller 106. In one embodiment, the user interface 112 may include, but is not limited to, one or more desktops, tablets, smartphones, smart watches, or the like. In another embodiment, the user interface 112 includes a display used to display data of the system 100 to a user. The display of the user interface 112 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 112 is suitable for implementation in the present disclosure. In another embodiment, a user may input selections and/or instructions responsive to data displayed to the user via the user interface 112.

Figure 2:
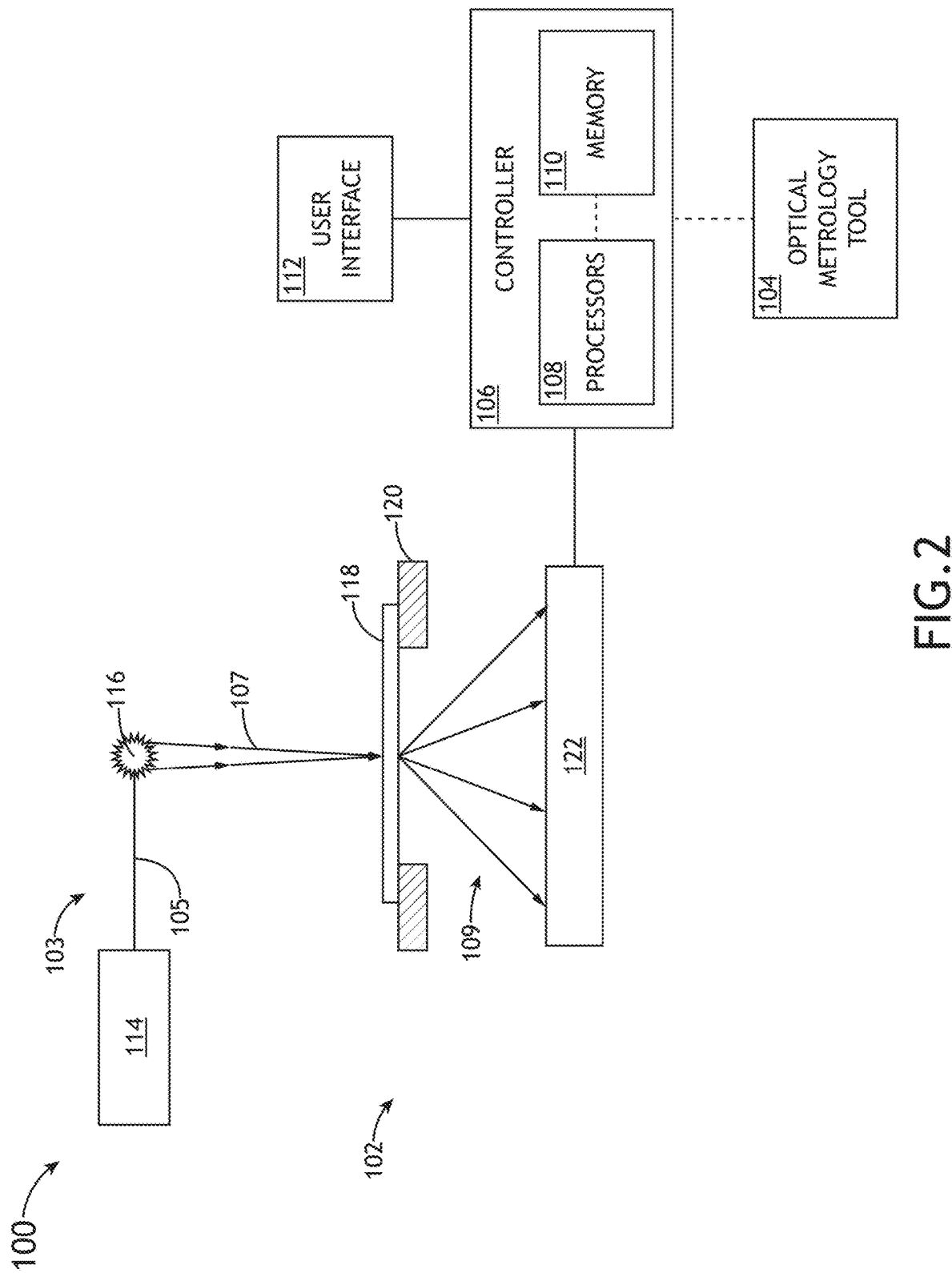
FIG. 2 illustrates a simplified block diagram of a metrology system including a reference metrology tool, in accordance with one or more embodiments of the present disclosure.

FIG. 2 illustrates a simplified block diagram of a metrology system 100 including a reference metrology tool 102, in accordance with one or more embodiments of the present disclosure. More particularly, FIG. 2 illustrates a simplified block diagram system 100 including an X-ray metrology tool (e.g., reference metrology tool 102). It is further noted herein, however, that the relative components and configuration of the reference metrology tool 102 illustrated in FIG. 2 are provided solely for illustrative purposes, and are not to be regarded as limiting, unless noted otherwise herein.

In one embodiment, the reference metrology tool 102 includes an X-ray source 103 configured to generate one or more X-ray beams 107 and an X-ray detector 122. The X-ray source 103 may include any X-ray source known in the art. In one embodiment, the X-ray source 103 includes a laser produced plasma (LPP) X-ray source. For example, the X-ray source 103 may include a laser source 114 configured to generate a beam 105 for pumping plasma 116. Responsive to the laser radiation, the plasma 116 may be configured to produce a spatially coherent X-ray beam 107.

In another embodiment, the X-ray source 103 is configured to direct one or more X-ray beams 107 to a sample 118 disposed on a stage assembly 120. The sample 118 may include any sample known in the art including, but not limited to, a semiconductor wafer, three-dimensional flash memory stack, three-dimensional vertical stacked structure, and the like. The stage assembly 120 may include any stage assembly known in the art configured to facilitate the movement of the sample 118 including, but not limited to, an X-Y stage or an R-θ stage. In another embodiment, stage assembly 120 is configured to adjusting the height of sample 118 during inspection to maintain focus on the sample 118.

The X-ray source 103 and the X-ray detector 122 may be arranged in transmission mode. In an additional and/or alternative embodiment, the X-ray source 103 and the X-ray detector 122 may be arranged in reflective mode. Conversely, the X-ray detector 122 is configured to collect the X-rays scattered from the sample 118. In one embodiment, the X-ray detector 122 is configured to obtain metrology data of the sample 118 by collecting/measuring the one or more X-ray diffraction patterns 109 caused by the one or more HAR structures, defects, or other features of the sample 118. In another embodiment, the X-ray detector 122 is configured to transmit collected and/or acquired metrology data to the controller 106.

Figure 3:
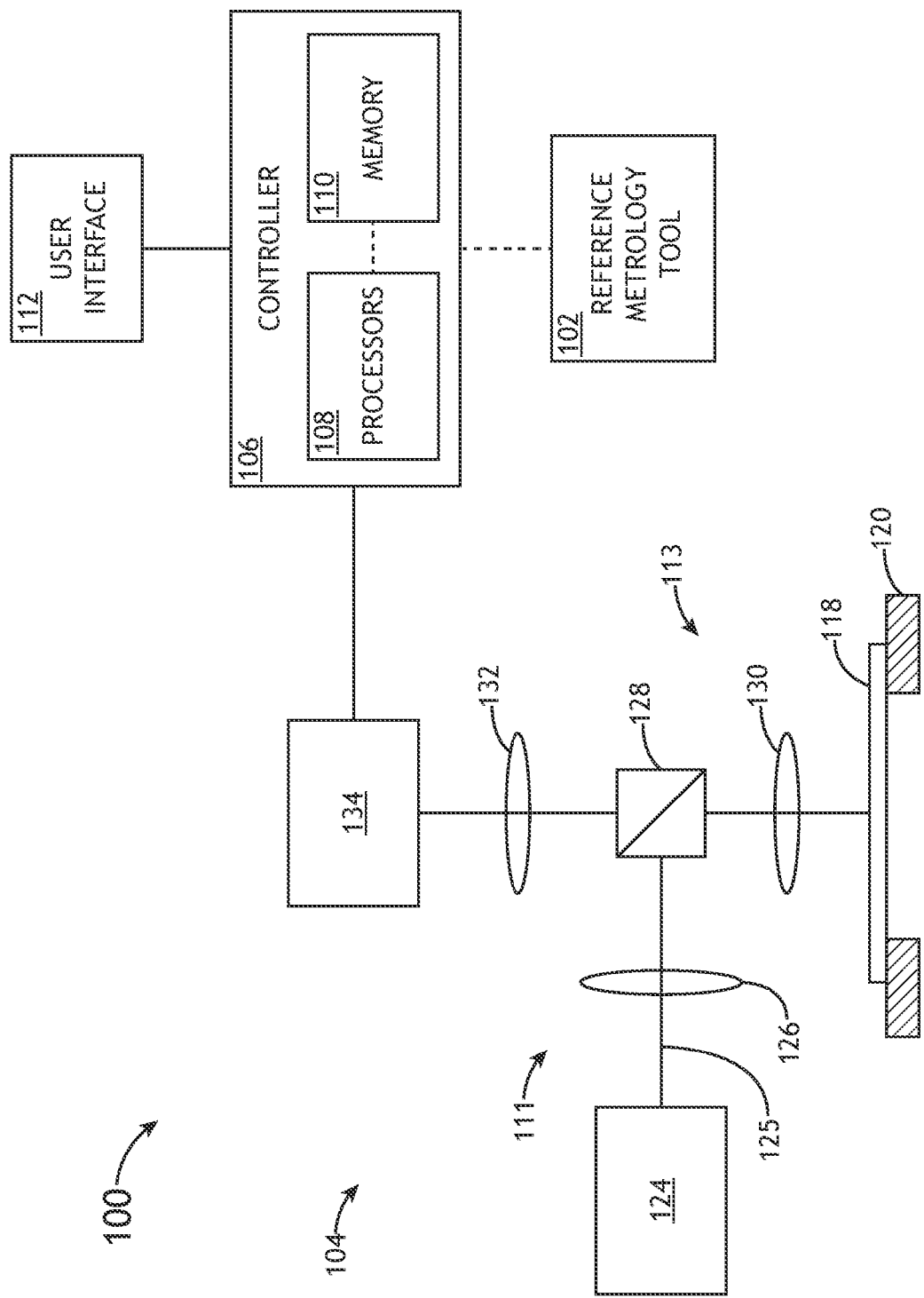
FIG. 3 illustrates a simplified block diagram of a metrology system including an optical metrology tool, in accordance with one or more embodiments of the present disclosure.

FIG. 3 illustrates a simplified block diagram of a metrology system 100 including an optical metrology tool 104, in accordance with one or more embodiments of the present disclosure. As noted previously herein, optical metrology tool 104 may include, but is not limited to, an optical critical dimension metrology tool. Optical metrology tool 104 may include, but is not limited to, an illumination source 124, an illumination arm 111, a collection arm 113, and a detector assembly 134.

In one embodiment, optical metrology tool 104 is configured to inspect and/or measure the sample 118 disposed on the stage assembly 120. Illumination source 124 may include any illumination source known in the art for generating illumination 125 including, but not limited to, a broadband radiation source.

In another embodiment, optical metrology tool 104 may include an illumination arm 111 configured to direct illumination 125 to the sample 118. It is noted that illumination source 124 of optical metrology tool 104 may be configured in any orientation known in the art including, but not limited to, a dark-field orientation, a light-field orientation, and the like. The illumination arm 111 may include any number and type of optical components known in the art. In one embodiment, the illumination arm 111 includes one or more optical elements 126, a beam splitter 128, and an objective lens 130. In this regard, illumination arm 111 may be configured to focus illumination 125 from the illumination source 124 onto the surface of the sample 118. The one or more optical elements 126 may include any optical elements known in the art including, but not limited to, one or mirrors, one or more lenses, one or more polarizers, one or more beam splitters, and the like.

In another embodiment, optical metrology tool 104 includes a collection arm 113 configured to collect illumination reflected or scattered from sample 118. In another embodiment, collection arm 113 may direct and/or focus the reflected and scattered light to one or more sensors of a detector assembly 134. It is noted that detector assembly 134 may include any sensor and detector assembly known in the art for detecting illumination reflected or scattered from the sample 118.

In another embodiment, the detector assembly 134 of the optical metrology tool 104 is configured to collect metrology data of the sample 118 based on illumination reflected or scattered from the sample 118. In another embodiment, the detector assembly 134 is configured to transmit collected and/or acquired metrology data to the controller 106.

As noted previously herein, the controller 106 of system 100 may include one or more processors 108 and memory 110. The memory 110 may include program instructions configured to cause the one or more processors 108 to carry out various steps of the present disclosure. In one embodiment, the program instructions are configured to cause the one or more processors 108 to: cause the reference metrology tool 102 to collect metrology data of a sample 118 including one or more HAR structures; cause the optical metrology tool 104 to collect metrology data of the sample 118; generate a geometric model for determining a profile of a test HAR structure from metrology data from reference metrology tool 102; generate a material model for determining one or more material parameters of a test HAR structure from metrology data from the optical metrology tool 104; form a composite model from the geometric model and the material model for determining a profile of a test HAR structure based on metrology data from the optical metrology tool 104; measure at least one additional test HAR structure with the optical metrology tool 104; and determine a profile of the at least one additional test HAR structure based on the composite model and metrology data from the optical metrology tool 104 associated with the at least one HAR test structure. The various steps of the present disclosure will be described in further detail with respect to FIG. 4.

Figure 4A:
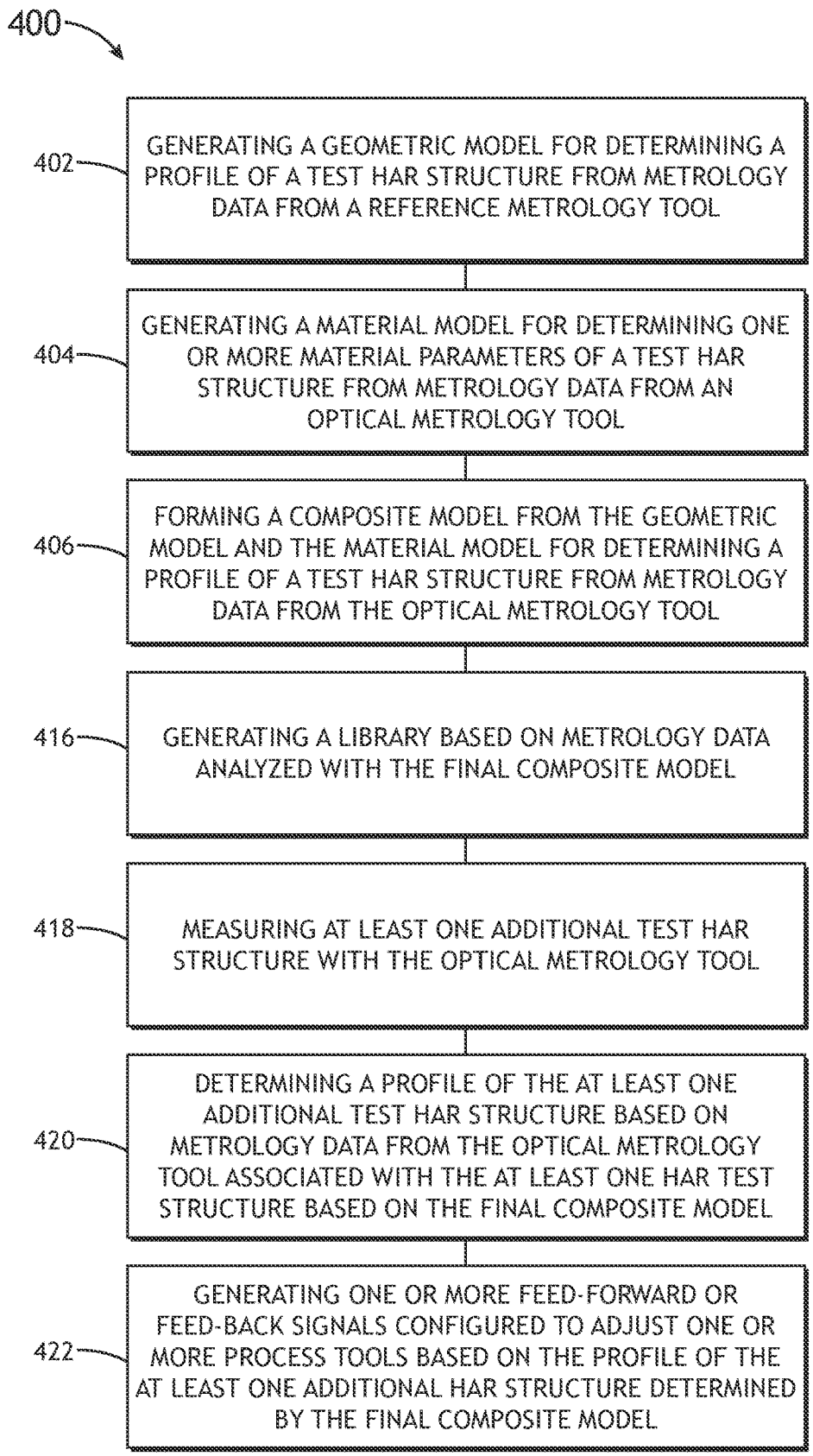
FIG. 4A illustrates a flowchart of a method for characterizing high aspect ratio structures, in accordance with one or more embodiments of the present disclosure.

FIG. 4A illustrates a flowchart of a method 400 for characterizing high aspect ratio (HAR) structures, in accordance with one or more embodiments of the present disclosure. Method 400 may be used to characterize any number of physical characteristics of HAR structures including, but not limited to, CDs, asymmetry, twist, and the like. In some embodiments, physical properties of HAR structures are measured using a composite model based on metrology data from a high-throughput metrology tool (e.g., optical metrology tool 104), where the composite model is generated at least in part based on reference measurements from a high-resolution metrology tool (e.g., reference metrology tool 102). In this regard, the composite model may combine benefits of high-resolution measurements of reference samples with high-throughput metrology. It is noted herein that the steps of method 400 may be implemented all or in part by system 100. It is further recognized, however, that the method 400 is not limited to the system 100 in that additional or alternative system-level embodiments may carry out all or part of the steps of method 400.

In a step 402, a geometric model is generated for determining one or more physical characteristics (e.g., a profile) of a test HAR structure based on metrology data received from a reference metrology tool (e.g., reference metrology tool 102). As it is used herein, the term "geometric model" refers to a model for determining a profile of a HAR structure including specific geometric information regarding the HAR structure. For example, the geometric model may determine a detailed profile of a HAR structure by mapping specific heights and/or height ratios of the HAR structure to corresponding CD values, asymmetry, twist values of the HAR structure, and the like. In this regard, the geometric model may provide HAR profile data of a sample 118 based on metrology data from the reference metrology tool 102.

For example, the one or more processors 108 may be configured to cause a reference metrology tool 102 to collect metrology data of one or more test HAR structures of a sample 118. The one or more processors 108 may be further configured to receive metrology data collected by the reference metrology tool 102 and save the metrology data in memory 110. The one or more processors 108 may be further configured to generate a geometric model for determining a profile of at least one of the test HAR structures.

In one embodiment, the geometric model is generated based on metrology data associated with two or more test HAR structures on one or more reference samples 118. For example, the HAR test structures may include, operate as, or be incorporated within metrology targets located at any location on the reference samples 118 (e.g., in cells, in scribe lines, or the like). The metrology targets may include any type of metrology target known in the art such as, but not limited to, an in-cell target, or a box target. The geometric model may be based on metrology data associated with measurement of any selected reference metrology tool 102. Furthermore, the selected reference metrology tool 102 may generate metrology data based on any type of measured material property. For example, in the case of an X-ray metrology tool (e.g., CD-SAXS), the metrology data may be generated based on the carrier density.

In one embodiment, the geometric model may represent one or more physical characteristics of an HAR structure (e.g., profile data, CD values, asymmetry, twist, and the like) using a flexible mathematical description such as a polynomial curve, Gaussian function, or other non-linear function. For example, the profile of a test HAR structure may be represented by a geometric model including, but not limited to, a Gaussian function, a traditional polynomial, a Legendre polynomial, a Chebyshev polynomial, and the like. Accordingly, the modeled physical characteristics of the HAR structure may be determined by fitting metrology data from the reference metrology tool 102 using polynomial fitting methods.

The geometric model may represent the physical characteristics of a test HAR structure using any formulation known in the art. In one embodiment, the one or more processors 108 are configured to represent the profile of the test HAR structure according to the polynomial of the form shown in Equation 1:

$$P(x) = \sum_{i=0}^{n} a_i x^i = a_0 + a_1 x^1 + a_2 x^2 + \ldots + a_n x^n \quad (1)$$

where x represents a physical dimension, and $a_i$ represent parameters of the model. The parameters $a_i$ may relate to one or more aspects of the metrology data from the reference metrology tool 102 (e.g., diffraction angle, intensity, or the like). Additionally, as may be seen in Equation 1, the order of the polynomial (e.g., the value of n in Equation 1) may be flexibly adjusted to accurately represent the true profile of the test HAR structure.

It is noted herein that generating a geometric profile in step 402 may include generating a collection of one or more polynomials associated with various parameters of the HAR structures (e.g., CDs, asymmetry, twist values, and the like). For example, a geometric model may include three polynomials, wherein a first polynomial $P_1(x)$ describes detailed profile information of the HAR structure, a second polynomial $P_2(x)$ describes asymmetry of the HAR structure, and a third polynomial $P_3(x)$ describes twist of the HAR structure. In this regard, the generated geometric model may include any number of polynomials based upon metrology data received from the reference metrology tool 102 which, when taken together, describe geometric parameters of the HAR structure.

Although the geometric model is configured to describe various geometric parameters of the HAR structure, it is noted herein that the geometric model will inherently include data regarding material properties of the sample 118 in the spectral region of the reference metrology tool 102 (e.g., X-ray spectrum, and the like). In this regard, the geometric model may inherently include material property information (e.g., refractive index properties, absorption properties, and the like) of the sample 118 in the spectral region of the reference metrology tool 102. For example, the parameters $a_i$ of the geometric may be influenced by the spectrum (e.g., energy and/or wavelengths) of incident radiation used by the reference metrology tool 102 (e.g., the X-ray beams 107, or the like) as well as the material properties of the HAR structures in this spectral region.

In a step 404, a material model is generated for determining material and/or physical characteristics of a test HAR structure based on metrology data received from an optical metrology tool (e.g., a high-throughput metrology tool). For example, the one or more processors 108 may be configured to cause an optical metrology tool 104 to collect metrology data of a sample 118 (e.g., a sample including one or more HAR structures). The one or more processors 108 may be further configured to receive metrology data collected by the optical metrology tool 104 and store the metrology data in memory 110. The one or more processors 108 may be further configured to generate a material model for determining one or more material properties of a test HAR structure based on metrology data from the optical metrology tool 104.

The material model may represent material and/or physical characteristics of HAR structures using any formulation known in the art. In one embodiment, the material model represents one or more material and/or physical characteristics according to the polynomial of the form shown in Equation 1. In this regard, the material model may be used to determine values of at least some of the same characteristics of a test HAR structure as the geometric model (e.g., profile information, CD at various heights, asymmetry, twist, or the like), but may do so based on metrology data from the high-throughput metrology tool rather than the reference metrology tool 102. However, as noted previously herein, metrology data acquired by the optical metrology tool 104 may exhibit a lower resolution and/or accuracy than metrology data acquired by the reference metrology tool 102. Thus, it is contemplated herein that higher-order terms of the polynomials of the material model may include a certain degree of inaccuracy relative to the geometric model. It is further contemplated herein that polynomials of the material model may include fewer terms than the polynomials of the geometric model so as to avoid introduction of potential errors.

Further, as described previously herein with respect to the reference metrology tool 102, the material model may include material property information (e.g., refractive index properties, absorption properties, and the like) of the HAR structures in the spectral region of the optical metrology tool 104. For example, the parameters $a_i$ of the material model may be influenced by the spectrum (e.g., energy and/or wavelengths) of incident radiation used by the optical metrology tool 104 (e.g., the X-ray beams 107, or the like) as well as the material properties of the HAR structures in this spectral region.

In one embodiment, the material model is generated based on metrology data from the optical metrology tool 104 associated with one or more HAR structures on one or more reference samples 118, which may include, operate as, or be incorporated within metrology targets located at any location on the reference samples 118 (e.g., in cells, in scribe lines, or the like). For example, the one or more processors 108 may be configured to cause the optical metrology tool 104 to acquire metrology data from the metrology targets. In another embodiment, the optical metrology tool 104 may acquire metrology data of one or more film stacks representative of samples from which HAR structures are fabricated. For example, the one or more processors 108 may be configured to cause the optical metrology tool 104 to collect metrology data of targets/sites located adjacent or near to the one or more HAR structures that were fabricated using common processing steps as the HAR structures. In this regard, the film stacks may include, operate as, or be incorporated within metrology targets located at any location on the reference samples 118 (e.g., in cells, in scribe lines, or the like). Further, the metrology targets may include any type of metrology target known in the art such as, but not limited to, an in-cell target, or a box target. It is contemplated herein that acquiring metrology data (via refractive index data) from targets/sites located adjacent to HAR structures may provide complete and/or efficient modeling of the material properties of film stacks associated with HAR structures with OCD metrology data, which may then facilitate more accurate adjusting and modeling based on the reference metrology data in one or more subsequent steps.

It is further contemplated herein that metrology targets and/or sites measured in step 404 for the generation of the material model may include, but are not required to include, at least some of the same targets and/or sites measured in step 402 for the generation of the geometric model. Conversely, in some embodiments, the metrology targets and/or sites associated with the formation of the geometric model and the material model differ.

The material model may include a list of optical dispersions for materials existing in a full structure model for the sample 118 and/or test HAR structures. Each dispersion can be a table or a formula of refractive indices with respect to optical wavelengths. For example, the material model may be measured by the optical metrology tool 104 on or be calculated for the targets with similar process steps, such as 1D film target or a 2D film target. In one embodiment, material model may be created with a mapping from a set of electron density to a set of optical dispersions according to a predefined table.

In a step 406, a composite model incorporating aspects of both the geometric model and the material model is generated for determining physical and/or material characteristics (e.g., a profile) of a test HAR structure based on metrology data received from an optical metrology tool 104. In this regard, the composite model may be based on the geometric model, but is adapted to utilize metrology data from the optical metrology tool 104. Accordingly, the composite model may be regarded as a "new" or "updated" OCD model. In some embodiments, the one or more processors 108 are configured to store the composite model in memory 110.

As described previously herein, throughput limitations associated with the reference metrology tool 102 may provide practical limitations on the use of the tool in a production environment. However, the optical metrology tool 104 may provide a desired level of throughput, but at a lower resolution. Accordingly, the composite model may facilitate high-throughput metrology measurements while retaining at least a portion of the accuracy of the geometric model associated with the reference metrology tool 102.

In one embodiment, the composite model includes one or more equations (e.g., one or more polynomials $P_1(x)$, $P_2(x)$, $P_3(x)$, one or more Gaussian functions, or the like) which characterize both the physical geometry of the sample 118 being measured (e.g., CDs of HAR structures, depth of HAR structures, total film thickness, and the like), as well as material properties of the sample 118 (e.g., thickness of constituent films, refractive index values of constituent films, number of films within the sample 118, and the like). For example, the one or more processors 108 may be configured to extract geometry information expressed by polynomial curves from the geometric model using one or more algorithms or other mathematical procedures. The one or more processors 108 may be further configured to extract material information from the material model, and combine the material information with the geometry information to order to form the composite model.

Figure 4B:
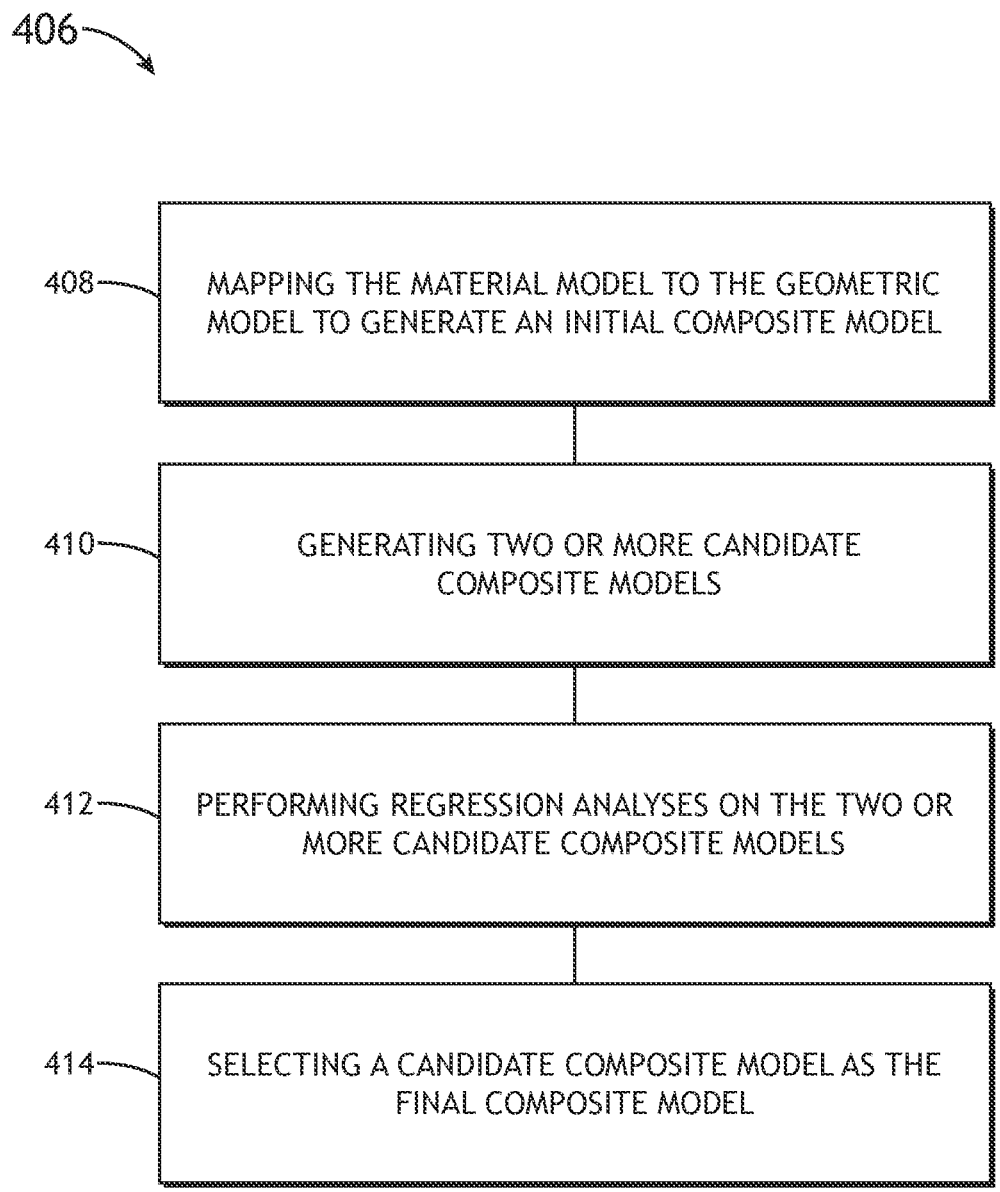
FIG. 4B illustrates a flowchart of a portion of a method for characterizing high aspect ratio structures, in accordance with one or more embodiments of the present disclosure.

Forming the composite model (Step 406) is described in further detail with respect to FIG. 4B.

FIG. 4B illustrates a flowchart of a portion of method 400 for characterizing high aspect ratio structures, in accordance with one or more embodiments of the present disclosure.

In a step 408, the material model is mapped to the geometric model to generate an initial composite model. It is recognized herein that material properties of the test HAR structure and/or sample 118 such as, but not limited to, refractive indices or absorption values may vary between different spectral regions. Further, the metrology data collected by the reference metrology tool 102 and the optical metrology tool 104 may be based on different material properties/characteristics. For example, as noted previously herein, CD-SAXS (e.g., reference metrology tool 102) may use carrier density as the material property on which to perform calculations. Comparatively, optical metrology tool 104 may utilize refractive indexes as the material property on which to perform calculations. In this regard, metrology data of the same target using different metrology tools (e.g., an X-ray-based reference metrology tool and an optical metrology tool) may differ. Accordingly, modeling parameters (e.g., the $a_i$ parameters) of the geometric model and the material model, as well as the associated relationships between metrology data and the characteristic of interest may also differ.

In a step 408, the material model is mapped to the geometric model in order to provide material parameters of a sample 118 (e.g., refractive indices as a function of wavelength) relevant to the spectral range of the optical metrology tool 104 into the framework of the geometric model. In this regard, metrology data received from the optical metrology tool 104 may be fit with the accuracy and/or precision of the geometric model by use of the initial composite model. Put in other terms, mapping the material model to the geometric model may provide a framework for fitting metrology data received from the optical metrology tool 104 to the geometric model via the initial composite model. In this procedure, various scientific computing algorithms, such as Rigorous Coupled Wave Analysis (RCWA), Finite-Difference Time-Domain (FDTD) and Finite Element Method (FEM) are implemented to solve the Electromagnetic (EM) problem induced by Maxwell's Equation, simulating synthetic signals for the given geometric model. In this regard, optimization algorithms are implemented to solve the inverse problem to fit the synthetic signals to the collected measurement signals. Analysis algorithms are implemented to optimize the geometry and material parameters in the model by indicating sensitivity of each parameter and correlation between pairs of parameters.

Considering, but not limited to, the polynomial model previously described herein, the geometric model may include a collection of one or more polynomials, in which the "coefficients" of the polynomials (e.g., $a_1$, $a_2$, $a_3$, and the like) include equations that incorporate one or more material parameters of the sample 118 as measured by the reference metrology tool 102. Similarly, the material model may include a collection of one or more polynomials, in which the "coefficients" of the polynomials (e.g., $a_1$, $a_2$, $a_3$, and the like) include equations that incorporate one or more material parameters of the sample 118 as measured by the optical metrology tool 104. In this example, mapping the material model to the geometric model may include performing one or more mathematical operations which convert or re-write coefficients of the geometric model into terms relevant to the optical metrology tool 104 based on the material model. In this regard, mapping the material model to the geometric model (e.g., generating the initial composite model) in step 408 includes adjusting the geometric model such that the geometric model may describe the HAR structure based on metrology data acquired from the spectral range of the optical metrology tool 104.

In a step 410, two or more candidate composite models are generated. It is recognized herein that the initial composite model generated in step 408 may include numerous parameters (e.g., $a_n$) that may be floated when performing a fit to metrology data from the optical metrology tool 104. Further, the number of films for three-dimensional stacked structures and stacked memory structures doubles every few years, which provides increasing modeling complexity. Thus, it may be desirable to float only a selected subset of the possible parameters. This may be carried out by generating and testing the two or more candidate composite models and selecting one of the candidate models as a final composite model.

In one embodiment, candidate composite models are generated by performing one or more adjustments to the initial composite model. The one or more adjustments performed on the initial composite model used to generate the one or more candidate composite models may include, but are not limited to: (1) truncating terms of the initial composite model, (2) fixing terms of the initial composite model, or (3) coupling two or more terms of the composite model to one another. Each of these adjustments will be addressed in turn.

In one embodiment, parameters of the initial composite model may be truncated to generate one or more candidate composite models. For example, the initial composite model may include a collection of polynomials, as shown in Equation 1. To generate a candidate composite model, one or more terms from at least one polynomial of the collection of polynomials may be truncated (i.e. removed/dropped) to provide a determined set of terms (e.g., cutoff order). As noted previously herein, metrology data acquired by the optical metrology tool 104 may have a limited resolution. In this regard, truncating one or more terms from at least one polynomial of the initial composite model may compensate for this lower resolution of the optical metrology tool 104 relative to the reference metrology tool 102.

In another embodiment, parameters of the initial composite model may be fixed (e.g., set to a particular value) in order to generate one or more candidate composite models. For example, it may be the case that one or more terms (e.g., higher-order terms) describe variations of the HAR structure at a smaller scale than the optical metrology tool 104 can resolve. Accordingly, such terms may be fixed to a nominal value rather than floated. For instance, such terms may be fixed to an average value (or any other selected value) based on the measurements of reference HAR samples 118 with the reference metrology tool 102 (e.g., in step 402). By way of another example, it may be determined that one or parameters may vary over only a relatively small range. Accordingly, such terms may be fixed to a value in the range.

In another embodiment, two or more terms of the initial composite model may be coupled to one another in order to generate one or more candidate composite models. For example, it may be determined that two or more parameters are highly correlated. Accordingly, one or more equations relating the parameters may be generated to reduce the total number of floating parameters. For instance, in the case that parameter $a_3$ is found to be consistently approximately half the value of $a_1$, the parameter $a_3$ may be set to $0.5 \cdot a_1$. Further, in the case of correlated parameters, any parameter may be defined in relation to any other parameter. However, it is recognized herein that lower-order parameters may typically have a greater contribution to the resulting profile. Accordingly, defining relatively higher-order parameters based on relatively lower-order parameters may facilitate accurate fits.

In a step 412, a regression analysis of the two or more candidate composite models is performed. In one embodiment, performing regression analyses on each of the two or more candidate composite models includes inputting metrology data from the optical metrology tool 104 into each of the candidate composite models, and comparing the result of each of the candidate composite models to metrology data from the reference metrology tool 102. In this regard, metrology data from the reference metrology tool 102 may be regarded as "reference" data against which the results from the candidate composite models may be compared.

In one embodiment, the one or more processors 108 are configured to run at least a portion of the regressions in parallel. As metrology data from the reference metrology tool 102 is obtained and received, the one or more processors 108 may optimize the model according to a set of predefined metrics such as, but not limited to, slope, R-square, mean square errors, bias, mean difference, and the like. It is further noted herein that additional and/or alternative dimension reduction methods may be applied to describe the reference data including, but not limited to, Principle Component Analysis (PCA), Linear Discriminant Analysis (LDA), and the like.

In one embodiment, the one or more processors 108 are configured to determine the range of each parameter by performing regression analyses on multiple sets of reference data. A range of each parameter may be determined to identify value ranges for each floating parameter which may be accepted during a regression and/or utilized in a library (e.g., associated with step 416). As noted previously, the one or more processors 108 may be configured to perform regression analyses using metrology data obtained from the reference metrology tool 102 associated with two or more test HAR structures. It is noted herein that metrology data upon which regression analyses are performed should be representative of all the process variation. In one embodiment, the range of at least one parameter is determined by extending the minimum and maximum value outward for n sigma, wherein sigma includes the standard variation of the parameters.

In a step 414, a candidate composite model is selected as a final composite model. In one embodiment, the candidate composite model which most accurately defines HAR structures using metrology data from the optical metrology tool 104, as determined by the regression analyses, is selected as the final composite model.

Reference will again be made to FIG. 4A. Once the composite model for optical metrology tool 104 is determined, it can be used for real time regression or generating library for fast measurement. In a step 416, a library is generated based on metrology data analyzed with the final composite mode. For example, a library may represent a mapping between aspects of metrology data and parameters of the final composite model based on fitting multiple representative reference datasets with the final composite model. In this regard, a library may represent an accurate approximation of the electromagnetic solution defined by the composite model. Further, it may be operationally faster to perform a regression of new metrology data to the final composite model based on the library than by other regression techniques. Statistics and values associated with the results of applying the metrology data to the final composite model may be stored in memory 110 as a library of values. In another embodiment, an alternative library may be constructed to directly approximate the inverse problem. In that case, the input of the alternative library may include the optical signals from optical metrology tool 104, and the output of the library may include the geometric parameters.

In another embodiment, the final composite model may be used to analyze one or more additional HAR structures. For example, the final composite model may be used to analyze one or more additional HAR structures on one or more additional samples 118. Application of the final composite model to one or more additional HAR structures is described in steps 418-422.

In a step 418, at least one additional test HAR structure is measured with the optical metrology tool 104. For example, the one or more processors 108 may be configured to cause the optical metrology tool 104 to acquire metrology data of at least one additional test HAR structure.

In a step 420, a profile of the at least one additional test HAR structure is determined based on metrology data from the optical metrology tool 104 associated with the at least one HAR structure and the final composite model. For example, the one or more processors 108 may be configured to receive metrology data associated with the additional test HAR structure from the optical metrology tool 104 and store the metrology data in memory 110. The one or more processors 108 may be further configured to determine a profile of the additional test HAR structure by applying the metrology data to the final composite model stored in memory 110. In an additional and/or alternative embodiment, a profile of the at least one test HAR structure may be determined based on the library stored in memory, wherein the library is used to map acquired metrology data to the final composite model. As noted previously herein, the stored library may provide for operationally faster computation and modeling of the profile of HAR structures, as compared to the traditional regression-based analysis which fits acquired metrology data to the final composite model.

In a step 422, one or more feed-forward or feed-back control signals are generated. The one or more feed-forward or feed-back control signals may be configured to adjust one or more process tools based on the profile of the at least one additional HAR structure determined by the final composite model. For example, if the additional HAR structure is determined, by the final composite model, to exhibit deviations from the planned profile of the HAR structure, the one or more processors 108 may be configured to generate one or more feed-back control signals configured to adjust one or more process tools involved in the fabrication of HAR structures on samples 118.

As noted previously herein, traditional OCD modeling approaches may be inaccurate and time-consuming. A traditional OCD modeling approach may be incapable of providing data regarding FinFETs in logic structures, or three-dimensional stacked memory structures. Comparatively, it is contemplated herein that embodiments of the present disclosure may utilize advantages provided by both OCD and CD-SAXS technologies. Additionally, embodiments of the present disclosure may allow substrate/sample manufacturers to accelerate process evolution, improve efficiency, and improve yield. Some embodiments of the present disclosure are directed to modeling of HAR structures using executable algorithms to carry out model optimization. Furthermore, it is contemplated herein that some embodiments of the present disclosure may be facilitated by machine learning. For example, instead of or in addition to an OCD model, as described herein, machine learning may be implemented based on metrology data obtained by the reference metrology tool 102 and HAR structure profile data as training targets.

While much of the present disclosure is directed to the measurement and analysis of HAR structures, this is not to be regarded as a limitation of the present disclosure, unless noted otherwise herein. In this regard, embodiments of the present disclosure may be applied to measure, inspect, or otherwise analyze a number of alternative and/or additional features including, but not limited to, poly-profiles in logic structures, contact holes in dynamic random-access memory (DRAM) structures, and the like.

Figure 5:
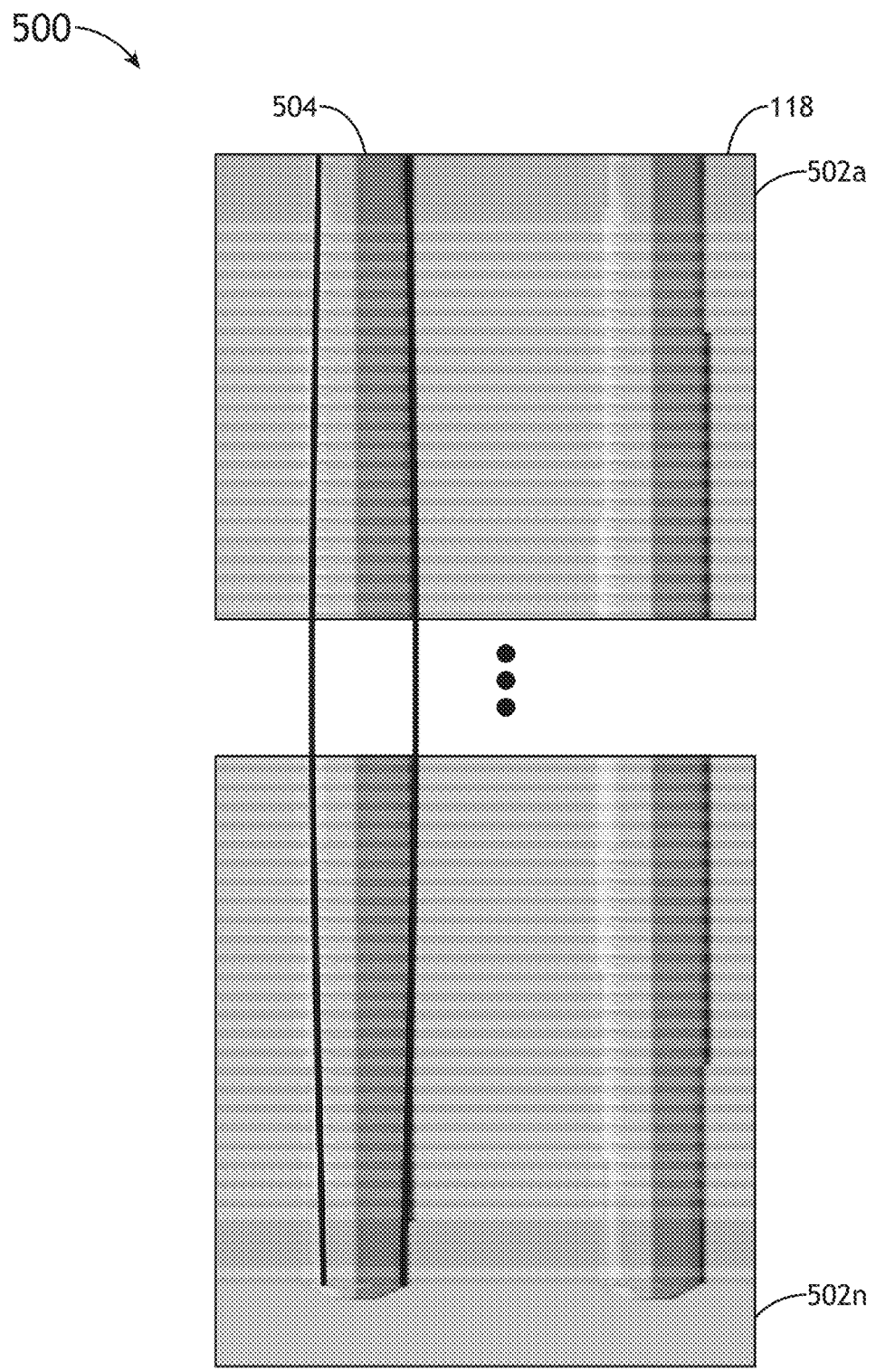
FIG. 5 illustrates a cross sectional view of a sample including a high aspect ratio structure, in accordance with one or more embodiments of the present disclosure.

FIG. 5 illustrates a cross sectional view 500 of a sample 118 including a high aspect ratio (HAR) structure 504, in accordance with one or more embodiments of the present disclosure. As may be seen in FIG. 5, the HAR structure 504 transverses throughout the sample 118 through multiple stacked films 502a-502n. As it is described herein, a target of measurement associated with the HAR structure 504 may be the profile of the HAR structure 504, which includes the critical dimension (CD) of the HAR structure 504 at varying heights.

An example may prove to be illustrative. In this example, a sample 118 (e.g., three-dimensional stacked memory structure) with a plurality of HAR structures 504 was provided. A CD-SAXS tool (e.g., reference metrology tool 102) was used to collect metrology data associated with ten different sites (e.g., ten different HAR structures 504). Critical dimension data was collected at eleven different heights for each HAR structure. A geometric model was built based on the metrology data acquired by the CD-SAXS tool (e.g., reference metrology tool 102).

Continuing with the same example, an optical metrology tool 104 was used to collect metrology data and determine material characteristic information based on refractive index information of the sample 118. Material information was collected by acquiring metrology data, with the optical metrology tool 104, of portions of the sample 118 adjacent to each HAR structure 504. In this regard, metrology data was acquired by the optical metrology tool 104 from portions of the sample without an HAR structure 504 (e.g., adjacent to HAR structures 504). It is noted herein that collecting metrology data with the optical metrology tool 104 from portions without etched HAR structures 504 may allow for faster computational speeds for one-dimensional structures. Additionally, the film layers at locations adjacent to HAR structures 504 share the same conditions during sample 118 manufacturing process steps, suggesting a common layer thickness and refractive index for locations adjacent to HAR structures 504. It is noted herein, however, that metrology data may not be required to be collected by the optical metrology tool 104 from locations directly adjacent to the HAR structures 504. Continuing with the example, the metrology data from the optical metrology tool 104 was then used to generate a material model.

The geometric model generated based on the metrology data of the ten HAR structures 504 was then imported and combined with the material model in order to form a composite model (e.g., modified OCD model). Next, the geometric parameters and the and material parameters were floated to obtain fitting using the OCD signals of the three-dimensional sample 118 (e.g., three-dimensional stacked memory structure). It is noted herein that floating the geometric and material parameters may be required due to the fact that the approximation method may cause differences between three-dimensional and one-dimensional structures. Additionally, processes for three-dimensional structures may include etching steps which could affect one or more characteristics of the material/structure.

Continuing with the same example, analysis and regression procedures, as described previously herein, were conducted to determine the floating parameters by using metrology data obtained by the CD-SAXS (e.g., reference metrology tool 102) as reference data. It is noted herein that analysis steps described herein may help to investigate and fix values associated with the thicknesses of the bottom layers of film 502. As noted previously, one or more regression analyses which fix certain polynomial parameters may be carried out to ensure the output of the composite model accurately represents the reference data (e.g., metrology data from the reference metrology tool 102). In this regard, metrology data from the CD-SAXS (e.g., reference metrology tool 102) ensures the fidelity of the profile variation within one single site. Finally, the OCD library was generated. Upon validating the library, it was found that the composite model could reproduce the regression result, thus match the metrology data acquired by the CD-SAXS (e.g., reference metrology tool 102). Results of this example are further shown and described with reference to FIGS. 6A-6C.

Figure 6A:
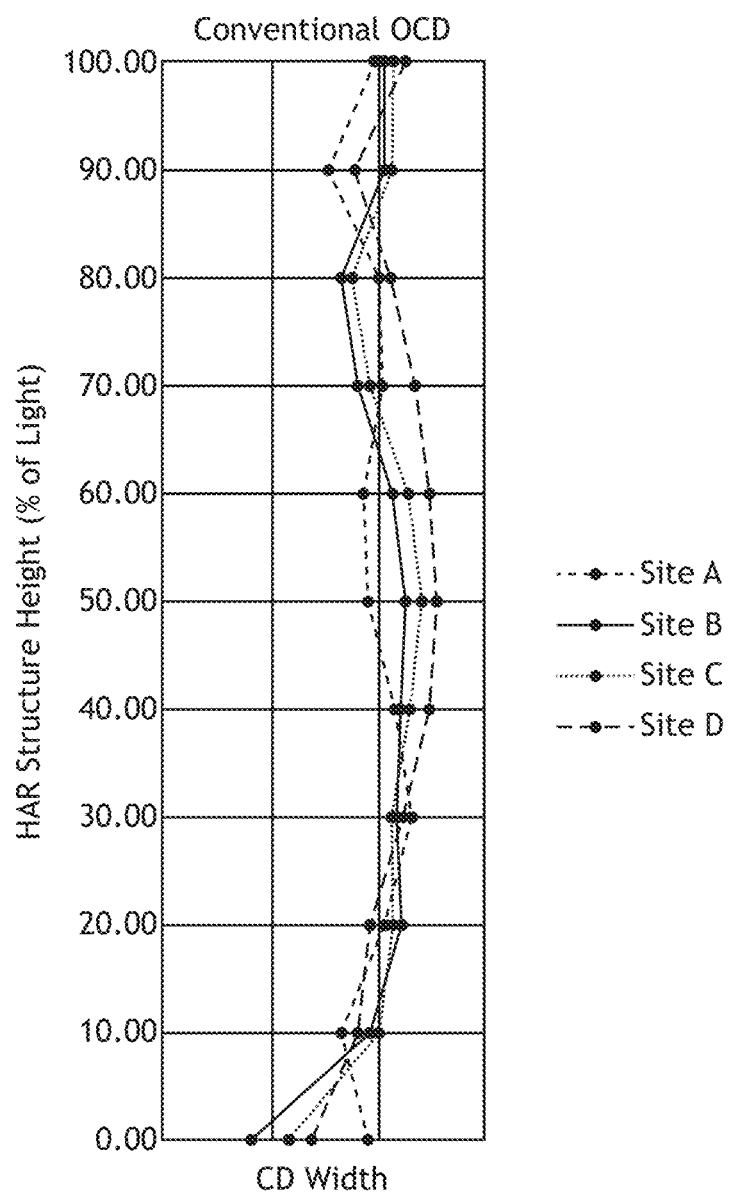
FIG. 6A illustrates a graph of critical dimension measurements from a conventional optical critical dimension tool, in accordance with one or more embodiments of the present disclosure.
Figure 6B:
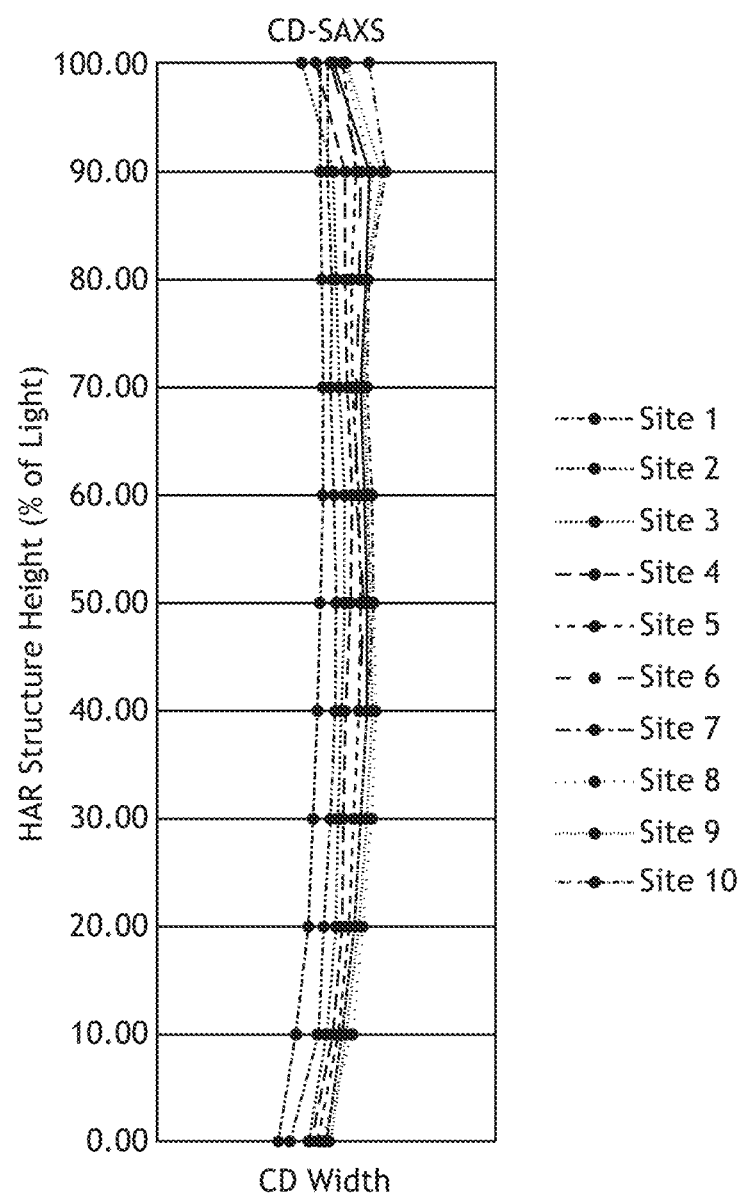
FIG. 6B illustrates a graph of critical dimension measurements from a critical dimension small angle X-ray scattering (CD-SAXS) tool, in accordance with one or more embodiments of the present disclosure.
Figure 6C:
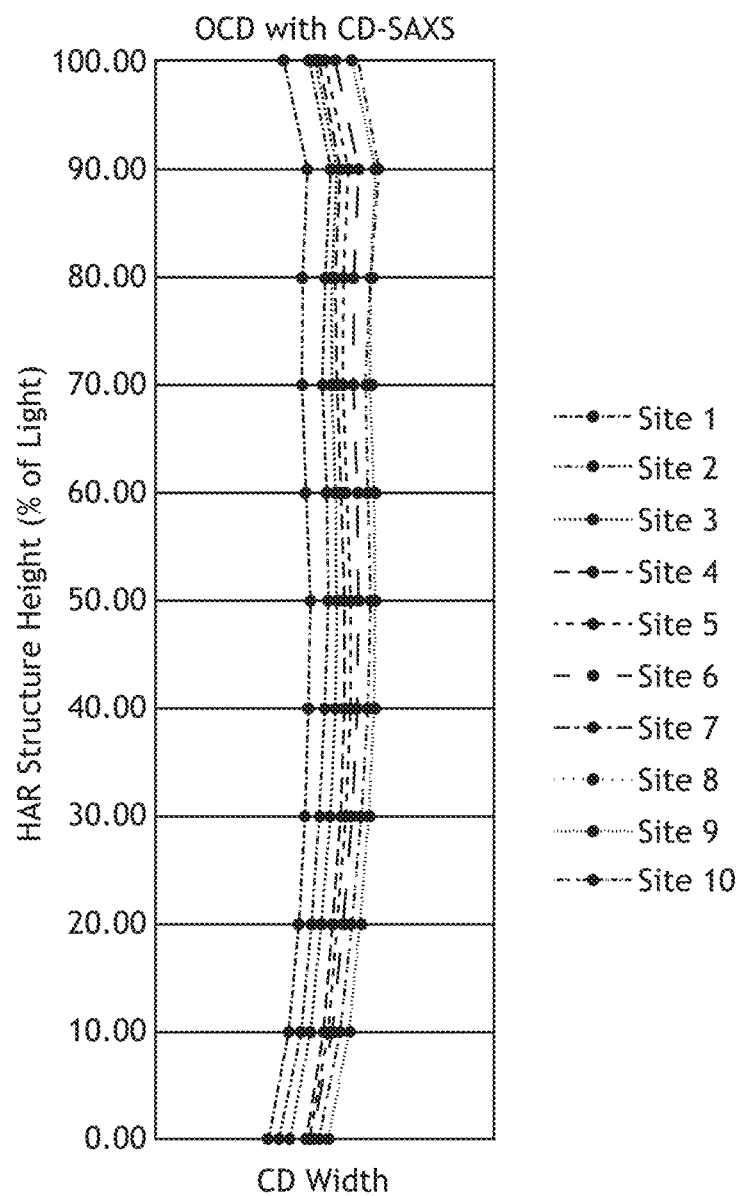
FIG. 6C illustrates a graph of critical dimension measurements obtained using both a conventional optical critical dimension tool and a critical dimension small angle X-ray scattering (CD-SAXS) tool, in accordance with one or more embodiments of the present disclosure.

FIG. 6A illustrates a graph 602 of critical dimension measurements from a conventional optical critical dimension tool (e.g., optical metrology tool 104), in accordance with one or more embodiments of the present disclosure. FIG. 6B illustrates a graph 604 of critical dimension measurements from a critical dimension small angle X-ray scattering (CD-SAXS) tool (e.g., reference metrology tool 102), in accordance with one or more embodiments of the present disclosure. FIG. 6C illustrates a graph 606 of critical dimension measurements obtained using both a conventional optical critical dimension tool (e.g., optical metrology tool 104) and a critical dimension small angle X-ray scattering (CD-SAXS) tool (e.g., reference metrology tool), in accordance with one or more embodiments of the present disclosure.

Generally, FIGS. 6A-6C illustrate critical dimensions of various sites along the x-axis against the HAR structure 504 height along the y-axis. In this regard, FIGS. 6A-6C illustrate determined critical dimensions of various sites (e.g., HAR structures 504) along the entire height of each HAR structure 504.

As shown in graph 602, conventional OCD modeling techniques are not capable of describing the profile of an HAR structure 504 accurately on their own. This is illustrated by the non-uniform profiles shown in graph 602. By comparing graph 602 to graph 604, it may be seen that CD-SAXS is far more accurate in describing the profiles of HAR structures 504. Furthermore, as shown in FIG. 6C, OCD with CD-SAXS reference exhibits very uniform profiles for all the sites, despite the difference of the nominal CD value for them. Accordingly, it was demonstrated that embodiments of the present disclosure which combine metrology data from both an optical metrology tool 104 and a reference metrology tool 102 may be able to more accurately and efficiently model profiles of HAR structures 504 as compared to traditional OCD modeling techniques.

It is further noted herein that the metrology data collected by the reference metrology tool 102 and the optical metrology tool 104 may not be required to be associated with the same sites (e.g., same HAR structures 504). In this regard, the reference metrology tool 102 may collect metrology data associated with a first set of HAR structures 504, and the optical metrology tool 104 may collect metrology data associated with a second set of HAR structures 504, wherein at least one of the HAR structures 504 of the second set is different from the HAR structures 504 of the first set. For example, as shown in FIG. 6A, the optical metrology tool 104 collected metrology data for HAR structures 504 including Sites A-D. Conversely, as shown in FIG. 6B, the reference metrology tool 102 collected metrology data for HAR structures 504 including Sites 1-10, which are different sites than Sites A-D.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A metrology system for high aspect ratio (HAR) structures comprising:
   a controller communicatively coupled to a reference metrology tool and an optical metrology tool, the controller including one or more processors configured to execute program instructions configured to cause the one or more processors to:
   generate a geometric model for determining a profile of a test HAR structure from metrology data from the reference metrology tool;
   generate a material model for determining one or more material parameters of a test HAR structure from metrology data from the optical metrology tool;
   form a composite model from the geometric model and the material model for determining a profile of a test HAR structure based on metrology data from the optical metrology tool;
   measure at least one additional test HAR structure with the optical metrology tool; and
   determine a profile of the at least one additional test HAR structure based on the composite model and metrology data from the optical metrology tool associated with the at least one additional HAR test structure.

2. The metrology system of claim 1, wherein the geometric model is generated based on metrology data from the reference metrology tool associated with two or more test HAR structures on one or more reference samples.

3. The metrology system of claim 2, wherein the material model is generated based on metrology data from the optical metrology tool associated with one or more film stacks on the one or more reference samples, wherein the one or more film stacks and the two or more test HAR structures are formed using common process steps.

4. The metrology system of claim 1, wherein the composite model comprises a final composite model.

5. The metrology system of claim 4, wherein forming the final composite model from the geometric model and the material model for determining the profile of the test HAR structure from metrology data from the optical metrology tool comprises:
mapping the material model to the geometric model to generate an initial composite model.

6. The metrology system of claim 5, wherein the forming the final composite model from the geometric model and the material model for determining the profile of the test HAR structure from metrology data from the optical metrology tool further comprises:
generating two or more candidate composite models from the initial composite model;
performing two or more regression analyses on the two or more candidate composite models using metrology data from the reference metrology tool as reference data; and
selecting a candidate composite model as the final composite model, wherein the candidate composite model with highest accuracy based on the two or more regression analyses is selected as the final composite model.

7. The metrology system of claim 6, wherein at least one of the two or more composite models comprise:
one or more mathematical functions, wherein each of the one or more mathematical functions describes at least one of a geometric parameter or a material parameter of the test HAR structure from metrology data from the optical metrology tool.

8. The metrology system of claim 7, wherein the one or more mathematical functions include at least one of a traditional polynomial, a Legendre polynomial, a Chebyshev polynomial, or a Gaussian function.

9. The metrology system of claim 7, wherein the at least one geometric parameter or the material parameter includes at least one of HAR structure profile, asymmetry of the HAR structure, or twist of the HAR structure.

10. The metrology system of claim 6, wherein the generating the two or more candidate composite models includes truncating one or more terms of the initial composite model.

11. The metrology system of claim 6, wherein the generating the two or more candidate composite models includes fixing one or more terms of the initial composite model to a nominal value.

12. The metrology system of claim 6, wherein the generating the two or more candidate composite models includes coupling two or more terms of the initial composite model to one another.

13. The metrology system of claim 1, wherein the optical metrology tool comprises:
an optical critical dimension metrology tool.

14. The metrology system of claim 1, wherein the reference metrology tool comprises:
an X-ray metrology tool.

15. The metrology system of claim 14, wherein the reference metrology tool comprises:
at least one of a small-angle X-ray scattering tool or a soft X-ray metrology tool.

16. The metrology system of claim 1, wherein the reference metrology tool comprises:
an electron-beam metrology tool.

17. The metrology system of claim 16, wherein the reference metrology tool comprises:
at least one of a scanning electron microscope or a transmission electron microscope.

18. The metrology system of claim 1, wherein the reference metrology tool comprises:
an atomic force microscope.

19. The metrology system of claim 1, wherein generate the geometric model comprises:
train a machine learning model with metrology data from the reference metrology tool associated with two or more test HAR structures on one or more reference samples.

20. The metrology system of claim 19, wherein generate the material model comprises:
train a machine learning model with metrology data from the optical metrology tool associated with one or more film stacks on the one or more reference samples, wherein the one or more film stacks and the two or more test HAR structures are formed using common process steps.

21. The metrology system of claim 20, wherein form the composite model comprises:
train a machine learning model with metrology data from the reference metrology tool and metrology data from the optical metrology tool.

22. A metrology system for high aspect ratio (HAR) structures, comprising:
a reference metrology tool;
an optical metrology tool; and
a controller communicatively coupled to the reference metrology tool and the optical metrology tool, the controller including one or more processors configured to execute program instructions configured to cause the one or more processors to:
generate a geometric model for determining a profile of a test HAR structure from metrology data from the reference metrology tool;
generate a material model for determining one or more material parameters of a test HAR structure from metrology data from the optical metrology tool;
form a composite model from the geometric model and the material model for determining a profile of a test HAR structure from metrology data from the optical metrology tool;
measure at least one additional test HAR structure with the optical metrology tool; and
determine a profile of the at least one additional test HAR structure based on metrology data from the optical metrology tool associated with the at least one additional HAR test structure based on the composite model.

23. A metrology method for high aspect ratio (HAR) structures comprising:
generating a geometric model for determining a profile of a test HAR structure from metrology data from a reference metrology tool;
generating a material model for determining one or more material parameters of a test HAR structure from metrology data from an optical metrology tool;
forming a composite model from the geometric model and the material model for determining a profile of a test HAR structure from metrology data from the optical metrology tool;

measuring at least one additional test HAR structure with the optical metrology tool; and determining a profile of the at least one additional test HAR structure based on the final composite model and metrology data from the optical metrology tool associated with the at least one additional HAR test structure.

24. The metrology method of claim 23, wherein the geometric model is generated based on metrology data from the reference metrology tool associated with two or more reference HAR structures on one or more reference samples.

25. The metrology method of claim 24, wherein the material model is generated based on metrology data from the optical metrology tool associated with one or more film stacks on the one or more reference samples, wherein the one or more film stacks and the two or more reference HAR structures are formed using common process steps.

26. The metrology method of claim 23, wherein the composite model comprises a final composite model.

27. The metrology method of claim 26, wherein forming the final composite model from the geometric model and the material model for determining the profile of the test HAR structure from metrology data from the optical metrology tool comprises:

mapping the material model to the geometric model to generate an initial composite model.

28. The metrology method of claim 27, wherein the forming the final composite model from the geometric model and the material model for determining the profile of the test HAR structure from metrology data from the optical metrology tool further comprises:

generating two or more candidate composite models from the initial composite model;

performing two or more regression analyses on the two or more candidate composite models using metrology data from the reference metrology tool as reference data; and selecting a candidate composite model as the final composite model, wherein the candidate composite model with highest accuracy based on the two or more regression analyses is selected as the final composite model.

29. The metrology method of claim 28, wherein at least one of the two or more composite models comprise:

one or more mathematical functions, wherein each of the one or more mathematical functions describes at least one of a geometric parameter or a material parameter of the test HAR structure from metrology data from the optical metrology tool.

30. The metrology method of claim 29, wherein the one or more mathematical functions include at least one of a traditional polynomial, a Legendre polynomial, a Chebyshev polynomial, or a Gaussian function.

31. The metrology method of claim 29, wherein the at least one geometric parameter or the material parameter includes at least one of HAR structure profile, asymmetry of the HAR structure, or twist of the HAR structure.

32. The metrology method of claim 28, wherein the generating the two or more candidate composite models includes truncating one or more terms of the initial composite model.

33. The metrology method of claim 28, wherein the generating the two or more candidate composite models includes fixing one or more terms of the initial composite model to a nominal value.

34. The metrology method of claim 28, wherein the generating the two or more candidate composite models includes coupling two or more terms of the initial composite to one another.

35. The metrology method of claim 23, wherein the optical metrology tool comprises:

an optical critical dimension metrology tool.

36. The metrology method of claim 23, wherein the reference metrology tool comprises at least one of an X-ray metrology tool, an electron-beam metrology tool, a scanning electron microscope, a transmission electron microscope, or an atomic force microscope.

37. A metrology system, comprising:

a controller communicatively coupled to a reference metrology tool and an optical metrology tool, the controller including one or more processors configured to execute program instructions configured to cause the one or more processors to:

receive metrology data from the reference metrology tool associated with two or more test HAR structures on one or more reference samples;

receive metrology data metrology data from the optical metrology tool associated with one or more film stacks on the one or more reference samples, wherein the one or more film stacks and the two or more test HAR structures are formed using common process steps;

form a composite model for determining a profile of a test HAR structure based on metrology data from the optical metrology tool by training a machine learning model with the metrology data from the reference metrology tool and the metrology data from the optical metrology tool;

measure at least one additional test HAR structure with the optical metrology tool; and determine a profile of the at least one additional test HAR structure based on the composite model and metrology data from the optical metrology tool associated with the at least one additional HAR test structure.

* * * * *